United States Patent [19]

Yuasa

[11] Patent Number: 5,721,513
[45] Date of Patent: Feb. 24, 1998

[54] GAIN CONTROLLED AMPLIFICATION CIRCUIT HAVING DIFFERENTIAL AMPLIFIER

[75] Inventor: Tachio Yuasa, Kawasaki, Japan

[73] Assignee: Fujitsu Limited, Kanagawa, Japan

[21] Appl. No.: 656,420

[22] Filed: May 30, 1996

[30] Foreign Application Priority Data

Nov. 10, 1995 [JP] Japan ................. 7-292325

[51] Int. Cl.$^6$ ................................................. H03G 3/12
[52] U.S. Cl. ................................... 330/282; 330/284
[58] Field of Search ............................ 330/51, 69, 86, 330/282, 284

[56] References Cited

U.S. PATENT DOCUMENTS

| | | | |
|---|---|---|---|
| 4,068,185 | 1/1978 | Christen et al. | 330/86 |
| 4,350,959 | 9/1982 | Rosenbaum | 330/86 X |
| 4,754,224 | 6/1988 | Maschek et al. | 330/282 X |
| 4,855,685 | 8/1989 | Hochschild | 330/282 |
| 5,138,280 | 8/1992 | Gingrich et al. | 330/295 |
| 5,406,636 | 4/1995 | Yamada et al. | 381/106 |

FOREIGN PATENT DOCUMENTS

| | | |
|---|---|---|
| 61-39726 | 2/1986 | Japan . |
| 61-129964 | 6/1986 | Japan . |

OTHER PUBLICATIONS

Patent Abstracts of Japan, vol. 10, n. 95 (E–395), 12 Apr. 1986 JP 60 2365009 A (Fujitsu K.K.), 25 Nov. 1985, abstract.

*Primary Examiner*—Steven Mottola
*Attorney, Agent, or Firm*—Nikaido Marmelstein Murray & Oram LLP

[57] ABSTRACT

An input signal is applied to a first input terminal of a differential amplifier through an input resistance, and a feedback signal is applied to the first input terminal through a feedback resistance. A reference potential is applied to a second input terminal of the differential amplifier. A capacitance element is connected between the second input terminal and a high potential power supply, and a capacitance element is connected between the second input terminal and a low potential power supply. The amplification ratio of an amplification circuit can be switched over multiple stages by switching the resistance values of the input resistance and the feedback resistance by semiconductor analog switches. When any fluctuation exists in a power supply voltage, the fluctuation component is applied to the first input terminal of the differential amplifier through the semiconductor analog switches and causes a fluctuation of the amplification ratio. This fluctuation component of the power supply voltage is applied to the second input terminal from the capacitance element connected to the second input terminal. Since the differential amplifier eliminates the in-phase component of the signal applied to the second input terminal, the influence of the fluctuation of the power supply voltage on the input signal can be restricted because the capacitance element is connected to the second input terminal.

12 Claims, 5 Drawing Sheets

GAIN CONTROLLED AMPLIFICATION CIRCUIT HAVING DIFFERENTIAL AMPLIFIER

BACKGROUND OF THE INVENTION

1. Field of the Invention

This invention relates to an amplification circuit having a differential amplifier, for effecting gain controlled amplification which is fabricated in an integrated circuit in particular.

2. Description of the Related Art

Generally, an amplification factor $A_{NF}$ of an amplification circuit having a typical differential amplifier is expressed by $-R_f/R_s$ in the case of a typical inverting amplification circuit. Here, $R_s$ represents an input resistance and $R_f$ represents a feedback resistance. When $R_s=R_f$ is established, an inverting amplification circuit having $A_{NF}=-1$ can be obtained or when $R_f/R_s=n$ is established, an inverting amplification circuit having $A_{NF}=-n$ can be obtained. In other words, an amplification factor $A_{NF}$ can be obtained in accordance with the values of $R_s$ and $R_f$ (resistance values).

In order to satisfy the requirement for a variable degree of amplification (amplification gain) especially for integrated circuit realization, an amplification circuit is known which constitutes each of the input resistance $R_s$ and the feedback resistance $R_f$ by a plurality of resistors connected in series, and which can adjust their resistance values by turning ON/OFF a plurality of semiconductor analog switches.

If the resistance values of a plurality of resistors constituting each of the input resistance $R_s$ and the feedback resistance $R_f$ are set to suitable values in the circuit construction described above, the amplification factor can be easily obtained over a plurality of stages in accordance with the number of ON/OFF combinations of the semiconductor analog switches.

However, in the amplification circuit capable of obtaining gain controlled amplification described above, there remains the problem that the ratio of fluctuation of an output voltage with respect to the change of a power supply voltage (so-called "SVRR": Supply Voltage Rejection Ratio) is likely to deteriorate because the semiconductor analog switches are connected only to one of the input terminals of the differential amplifier.

When a MOS switch is used as a typical semiconductor analog switch, the circuit is constituted by connecting in parallel two complementary MOS transistors, applying complementary control signals (the signals one of which is at a "0" level when the other of which is at a "1" level) to each gate, connecting the back gate of a P-channel MOS transistor to a power supply VDD on the high potential side and connecting the back gate of an N-channel MOS transistor to a power supply VSS on the low potential side.

According to this construction, when one of the control signals is set to the "0" level and the other, to the "1" level, the intended operation that the two MOS transistors are turned ON can be obtained. However, because the back gates of both transistors are connected to the power supply VDD on the high potential side and to the power supply VSS on the low potential side, respectively, the equality relation of the "1" level=VDD and the "0" level=VSS is not always insured. Accordingly, the voltage between the gates and the back gates of both transistors sometimes fluctuates. In this case, the resistance value between the drain and the source (channel ON resistance $R_{ON}$) of each transistor changes with the fluctuation of the power supply voltages, and a problem develops in that the frequency component of the fluctuation overlaps with the input signal of the differential amplifier.

When the frequency component of the power supply voltage fluctuation is high, its frequency component passes through the capacitance between the electrodes of the MOS switch, overlaps the input signal of the operational amplified and is amplified.

The problem described above similarly occurs in the case where an analog switch using bipolar transistors or diodes are used as the semiconductor switch.

SUMMARY OF THE INVENTION

It is an object of the present invention to provide an amplification circuit, for effecting gain controlled amplification, which has a differential amplifier and can improve the fluctuation ratio of an output voltage with respect to the fluctuation of a power supply voltage.

The present invention was completed in order to accomplish the object described above. The amplification circuit for effecting gain controlled amplification, having the differential amplifier, inputs an input signal to the first input terminal of the differential amplifier through an input resistance and inputs a reference potential to the second input terminal. This amplification circuit switches an amplification ratio over multiple stages by switching the resistance value of the input resistance and the resistance value of a feedback resistance by a semiconductor analog switch. In the amplification circuit, the present invention disposes a first capacitance element between the second input terminal of the differential amplifier and a high potential power supply and a second capacitance element between the second input terminal of the differential amplifier and a low potential power supply.

When the power supply voltage fluctuates in this amplification circuit, the fluctuation component is applied to the first input terminal of the differential amplifier through the semiconductor analog switch which switches the input resistance and the feedback resistance. At the same time, the fluctuation component of the power supply voltage is also applied to the second input terminal of the differential amplifier through the first and second capacitance elements. Since the differential amplifier has the function of removing the same phase component applied to the first and second input terminals thereof, the fluctuation components of the power supply voltage are cancelled and influences on the degree of amplification can be restricted.

In the second aspect of the present invention, in an amplification circuit having a differential amplifier, for effecting gain controlled amplification, a resistance element and a semiconductor analog switch are connected in series between the second input terminal and a reference potential. A semiconductor analog switch, having substantially the same characteristics as those of the semiconductor analog switch for switching the input resistance, and the feedback resistance is used as this semiconductor analog switch.

In this amplification circuit, the fluctuating component of the power supply voltage is input to the second input terminal of the differential amplifier through the capacitance element of the semiconductor analog switch, and influences due to the fluctuation of the power supply voltage are restricted. Further, the ON resistance value of the semiconductor analog switch, connected to the second input terminal, changes with the fluctuation of the power supply voltage, and offsets the fluctuation component of the ON resistance value of the semiconductor analog switch connected to the first input terminal of the differential amplifier.

BRIEF DESCRIPTION OF THE DRAWINGS

The above object and features of the present invention will be more apparent from the following description of the referred embodiments with reference to the accompanying drawings, wherein.

DESCRIPTION OF THE PREFERRED EMBODIMENTS

Before describing the embodiments of the present invention, the related art and the disadvantages therein will be described with reference to the related drawings.

Figure 1:
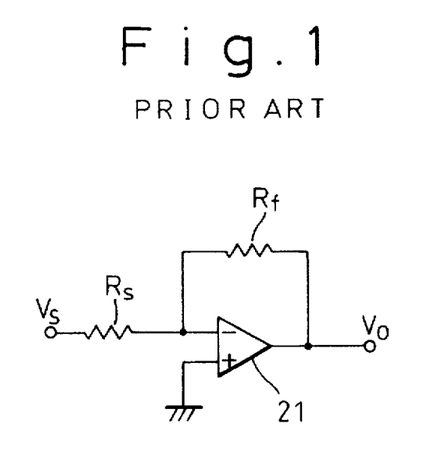
FIG. 1 is a circuit diagram showing an inverting amplification circuit according to the prior art.

An amplification factor $A_{NF}$ of an amplification circuit having a differential amplifier (typically, an operational amplifier 21, such as a typical inverting amplification circuit shown in FIG. 1, is given by $-R_f/R_s$. Here, $R_s$ represents an input resistance and $R_f$ represents a feedback resistance. When $R_s=R_f$, an inverting amplification circuit having $A_{NF}=-1$ can be obtained, and when $R_f/R_s=n$, an inverting amplification circuit having $A_{NF}=-n$ can be obtained. In other words, the amplification factor $A_{NF}=-n$ can be obtained in accordance with the resistance values $R_s$ and $R_f$.

Figure 2:
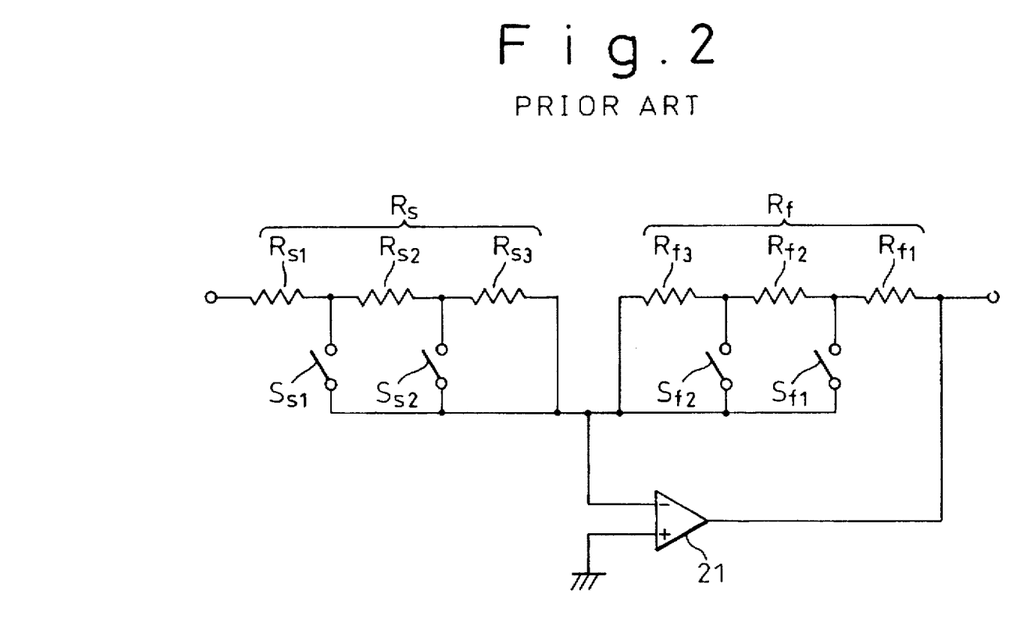
FIG. 2 is a circuit diagram showing an inverting amplification circuit for effecting gain controlled amplification according to the prior art.

In order to satisfy the requirement for a variable degree of amplification, an amplification circuit such as the one shown in FIG. 2 is employed from time to time. In this circuit, a plurality (three, in the drawing) of resistors $R_{s1}$ to $R_{s3}$ connected in series constitute an input resistor, and a plurality (three, in the drawing) of resistors $R_{f1}$ to $R_{f3}$ connected in series likewise constitute a feedback resistor. Further, the resistance values of $R_s$ and $R_f$ can be adjusted by the ON/OFF switching of a plurality of analog switches $S_{s1}$ and $S_{s2}$ and $S_{f1}$ and $S_{f2}$, respectively.

In the circuit construction described above, an amplification factor of multiple stages can be easily obtained in accordance with the number of combinations of ON/OFF of the analog switches $S_{s1}$ and $S_{s2}$ and $S_{f1}$ and $S_{f2}$ by suitably setting in advance the resistance values of a plurality of resistors constituting the input resistor $R_s$ and the feedback resistor $R_f$.

However, in the amplification circuit capable of obtaining the degrees of amplification of the multiple stages described above, the analog switches are connected to one of the inputs (the negative input in FIG. 2) of the operational amplifier 21. Therefore, there remains the problem that the ratio of the change of the output voltage to the change of a power supply voltage is likely to deteriorate.

Figure 3:
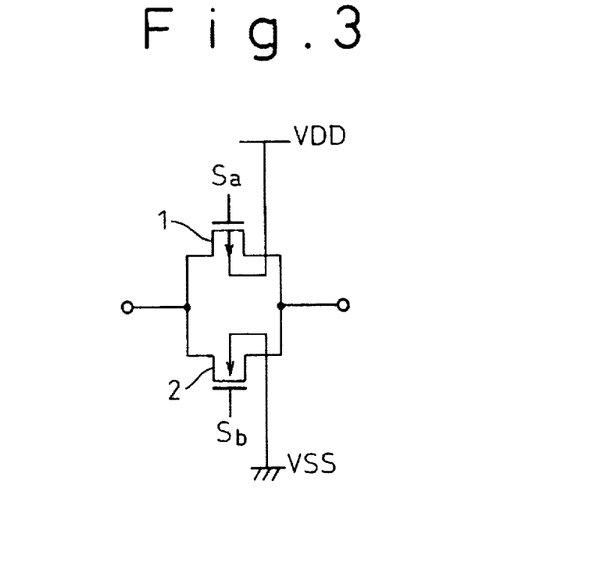
FIG. 3 is a circuit diagram showing an MOS switch.

FIG. 3 is a structural view of a typical analog switch using MOS transistors. Two complementary MOS transistors 1 and 2 are connected in parallel with each other, and complementary control signals (a set of signals one of which is at a "0" level when the other of which is at a "1" level) $S_n$ and $S_b$ are applied to each gate. A back gate of a P-channel MOS transistor 1 is connected to a power supply VDD on the high potential side, and the back gate of the N-channel type MOS transistor 2 is connected to a power supply VSS on the low potential side.

According to this circuit construction, the intended operation of turning ON both of the two MOS transistors 1 and 2 can be obtained by setting the control signals $S_n$ and $S_b$ to the "0" level and the "1" level, respectively. Nonetheless, because the back gates of both transistors are connected to the power supply VDD on the high potential side and to the power supply VSS on the low potential side, the voltage between the back gates of both transistors fluctuates, in some cases, since the equality relation of the "1" level=VDD and the "0" level=VSS is not always insured on actual electronics circuit. In this case, the drain-source resistance value (channel ON resistance $R_{ON}$) at the time of ON changes with the fluctuation of the power supply voltage, and there occurs the problem that its frequency component overlaps the input signal of the operational amplifier.

Figure 4:
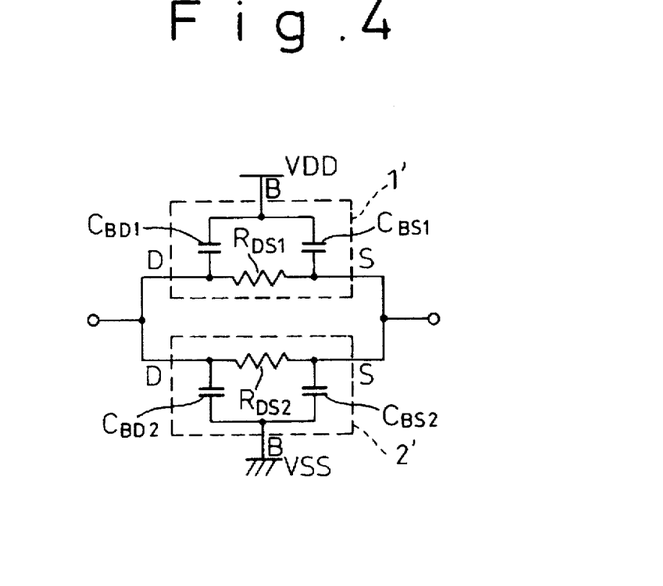
FIG. 4 is a circuit diagram showing an equivalent circuit of the MOS switch shown in FIG. 3.

FIG. 4 is an equivalent circuit diagram of the circuit shown in FIG. 3. Reference numeral 1' corresponds to the P-channel MOS transistor 1 and reference numeral 2' corresponds to the N-channel MOS transistor 2. Symbols B, D and S represents the back gate, the drain and the source, respectively. The capacitance between the back gate B and the drain D is represented by $C_{BDi}$ (i=1, 2; hereinafter the same), the capacitance between the back gate B and the source is represented by $C_{BSi}$, and the resistance between the drain D and the source S is represented by $R_{DSi}$.

The mechanism of deterioration of SVRR can be explained in the following two mechanisms by the frequency of the power supply fluctuation. In other words, (a) when the frequency is low, the mechanism is the change of the B–D voltage between the back gate B and the drain D, the change of the B–S voltage between the back gate B and the source S, the change of the G–D voltage between the gate G and the drain D, the change of the G–S voltage between the gate G and the source S, the change of the $R_{DSi}$ (channel ON resistance $R_{ON}$), the change of the input resistance $R_s$ and the change of the amplification factor $A_{NF}$ and (b) when the frequency is high, the mechanism is that the frequency component passes through the capacitance $C_{BDi}$ and the capacitance $C_{BSi}$ and overlaps with the input signal of the operational amplifier and is amplified.

To restrict the mechanism (a) (the fluctuation of the channel ON resistance $R_{ON}$), it is effective to design the MOS transistor so that $R_{ON}$ can be reduced to minimum. According to such a design method, however, the scale of the MOS transistor becomes great and the capacitance between the electrodes ($C_{BDi}$ and $C_{BSi}$) increases, so that the mechanism (b) is promoted and SVRR to the application where the operation frequency is high deteriorates. Accordingly, this method involves an inherent limit.

The explanation given above explains the example where the MOS switch is used as the semiconductor analog switch. Next, the explanation will be given on the example of an analog switch using a bipolar transistor as the semiconductor analog switch.

Figure 5:
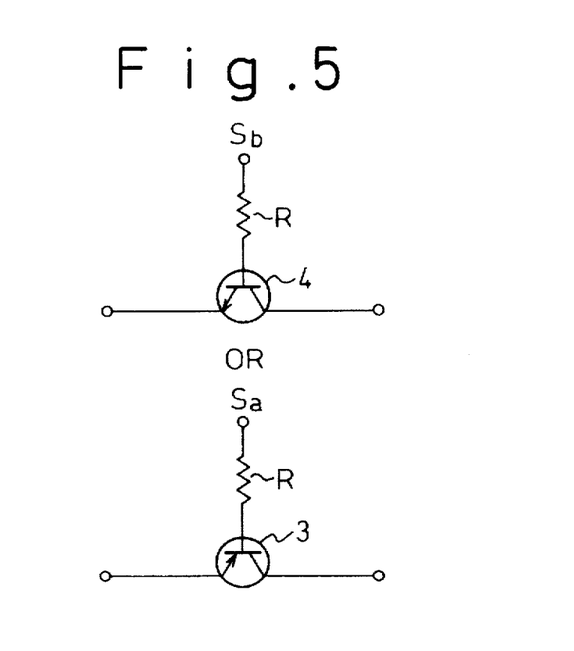
FIG. 5 is a circuit diagram showing the circuit construction of an analog switch.

FIG. 5 is a structural view of the analog switch using the bipolar transistors. The collector and the emitter of a PNP transistor 3 or an NPN transistor 4 are used as signal electrodes and the control signals $S_a$ or $S_b$ are applied to each base B through resistor R. Though the power supply VDD on the high potential side and the power supply VSS on the low potential side are not shown in this FIG. 3, the power supply applied to the substrate of the bipolar transistor depends on both transistor type (PNP or NPN) and its structure (lateral or vertical). The operation of this analog switch is the same as the operation of the MOS switch shown in FIG. 3.

Figure 6:
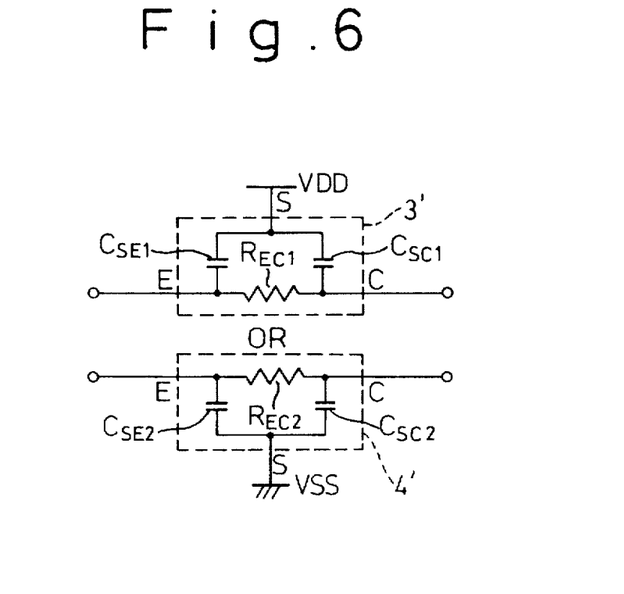
FIG. 6 is a circuit diagram showing an equivalent circuit of the analog switch shown in FIG. 5.

FIG. 6 is an equivalent circuit diagram of FIG. 5. Symbols E, C and S represent the emitter, the collector and the substrate, respectively, the capacitance between the substrate S and the emitter E is represented by $C_{SEi}$ and the capacitance between the substrate S and the collector C, by $C_{SCi}$.

The mechanism of deterioration of SVRR is divided into (a) the mechanism in which the resistance $R_{ECi}$ between the collector and the emitter changes due to the fluctuation of the substrate voltage and (b) the mechanism in which the capacitance $C_{SEi}$ between the substrate S and the emitter E and the capacitance $C_{SCi}$ between the substrate S and the collector C, and eventually, the capacitance between the emitter E and the collector C, increase when the transistor area is increased so as to reduce the resistance $R_{ECi}$ between the collector and the emitter E, and the frequency component of the voltage fluctuation overlaps the input signal of the operational amplifier through this capacitance.

Hereinafter, preferred embodiments of the present invention will be explained with reference to the drawings.

Figure 7:
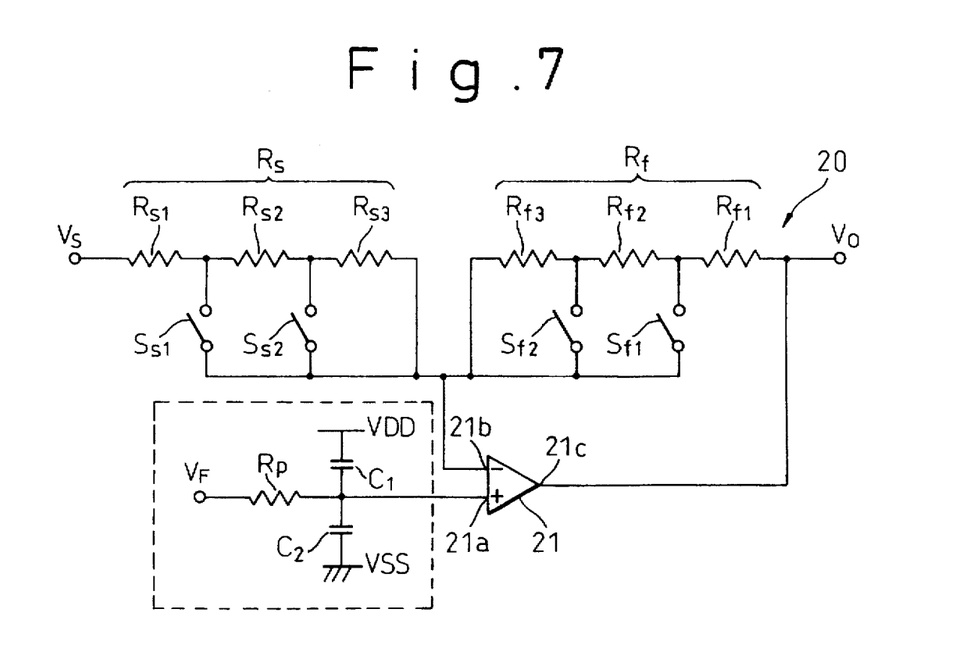
FIG. 7 is a circuit diagram showing an amplification circuit according to an embodiment of the present invention.

FIG. 7 is a circuit diagram showing an amplification circuit according to the first embodiment of the present invention.

In FIG. 7, reference numeral 20 denotes an inverting amplification circuit which multiplies the input signal $V_s$ by $-R_f/R_s$ and outputs the signal. Reference numeral 21 denotes an operational amplifier having a positive input terminal 21a, a negative input terminal 21b and an output terminal 21c. The input signal $V_s$ is applied to the negative input terminal 21b through the input resistor $R_s$, and a reference power supply $V_F$ is applied to the positive input terminal 21a through the resistance element $R_p$. The output signal is taken out from the output terminal 21c, and a feedback resistor $R_f$ is interposed between the output terminal 21c and the negative input terminal 21b.

Here, the input resistor $R_s$ includes three resistance elements $R_{s1}$ to $R_{s3}$ connected in series, and the feedback resistor $R_f$ likewise includes three resistance elements $R_{f1}$ to $R_{f3}$ connected in series. The number of series connections of these resistance elements can be adjusted to one to three resistors by the MOS switches $S_{s1}$ and $S_{s2}$ and the MOS switches $S_{f1}$ and $S_{f2}$, respectively. In other words, the resistance value of $R_s$ can be adjusted to "$R_{s1}$" ($S_{s1}$ ON, $S_{s2}$ OFF), "$R_{s1}+R_{s2}$" ($S_{s1}$ OFF, $S_{s2}$ ON ) and "$R_{s1}+R_{s2}+R_{s3}$" (both $S_{s1}$ and $S_{s2}$ OFF). The resistance value of $R_f$ can be similarly adjusted to "$R_{f1}$" ($S_{f1}$ ON, $S_{f2}$ OFF), "$R_{f1}+R_{f2}$" ($S_{f1}$ OFF, $S_{f2}$ ON) and "$R_{f1}+R_{f2}+R_{f3}$" (both $S_{f1}$ and $S_{f2}$ OFF). By the way, the number of the resistance elements is just exemplary and is not particularly limited to the above.

The characterizing portion of this embodiment is encompassed by dash lines in the drawing. In other words, the characterizing features of this embodiment reside in that a first capacitance element $C_1$ is connected between the positive input terminal 21a of the operational amplifier 21 and the power supply VDD on the high potential side, that the second capacitance element $C_2$ is connected between the positive input terminal 21a and the power supply VSS on the low potential side, and that a resistance element $R_p$ is connected between the positive input terminal 21a and a predetermined reference power supply $V_F$. The resistance element $R_p$ is inserted in order to increase the impedance between the positive input terminal 21a and the reference power supply $V_F$, and is not necessary if the internal impedance of the reference power supply $V_F$ is sufficiently high. Since the internal impedance of the voltage source is generally much lower than the effective resistor, to insert the resistance element $R_p$ is one of the essential requirements in this embodiment.

Figure 8:
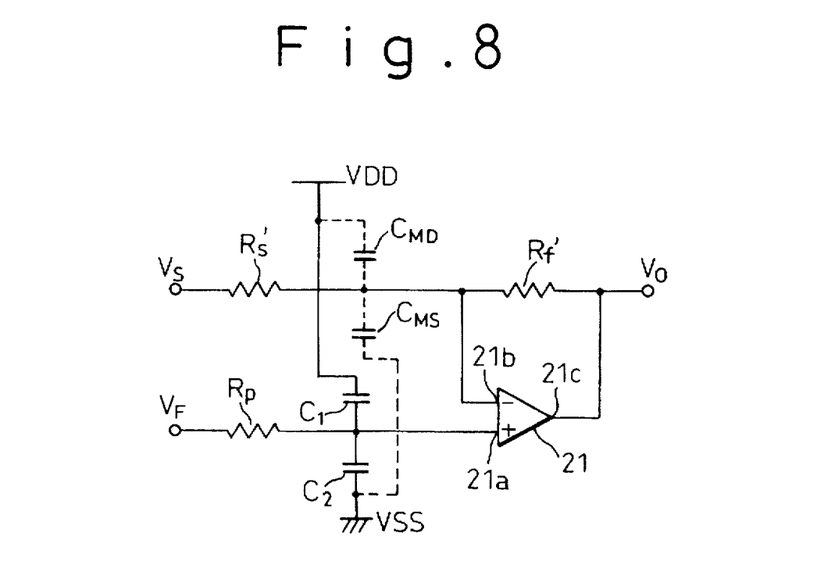
FIG. 8 is a circuit diagram showing an equivalent circuit of the circuit shown in FIG. 7.

FIG. 8 is an equivalent circuit diagram of the circuit shown in FIG. 7. Symbols $R_s'$ and $R_f'$ typically represent the values of the input resistance $R_s$ and the feedback resistance $R_f$ when the states of the MOS switches $S_{s1}$, $S_{s2}$, $S_{f1}$ and $S_{f2}$ assumes an arbitrary combination. Symbol $C_{MD}$ typically represents the parallel combined value of the capacitance $C_{BD1}$ between the back gate B and the drain D of the P-channel MOS transistor shown in FIG. 4 and the capacitance $C_{BS1}$ between the back gate B and the source S. Further, symbol $C_{MS}$ typically represents the parallel combined value of the capacitance $C_{BD2}$ between the back gate B and the drain D of the N-channel MOS transistor and the capacitance $C_{RS2}$ between the back gate B and the source S shown in FIG. 4.

In the circuit construction described above, when the power supply VDD on the high potential side or the power supply VSS on the low potential side fluctuates, the fluctuating component overlaps the negative input terminal 21b of the operational amplifier through the capacitance $C_{MD}$ or $C_{MS}$ (mechanism (b)). As a result, SVRR is about to deteriorate as first herein described but in this embodiment, the fluctuation component of the same phase is applied to the positive input terminal 21a of the operational amplifier 21 through the capacitances $C_1$ and $C_2$. Accordingly, deterioration of SVRR can be avoided by the same phase signal elimination effect of the operational amplifier 21, and this embodiment can obtain the advantage, which the prior art has not been able to attain, in that SVRR can improve irrespective of the frequency of the voltage fluctuation of the power supply.

Here, the output signal $V_o$ of the operational amplifier 21 can be expressed by the following equation (1) where $\Delta V(-)$ is the fluctuating component of the power supply voltage VDD or VSS applied to the negative input terminal 21b of the operational amplifier 21 through the capacitance $C_{MD}$ or $C_{MS}$ of the MOS switch, and $\Delta V(+)$ is the fluctuating component applied to the positive input terminal 21a through the capacitance $C_1$ or $C_2$:

$$V_o = V_s(-R_f/R_s) + A(\Delta V(+) - \Delta V(-)) \quad (1)$$

with the proviso that A is a differential amplification factor of the operational amplifier 21. Assuming hereby that $\Delta V(+) = \Delta V(-)$ is established by adjusting the values of the capacitances $C_1$ and $C_2$ and the value of the resistance element $R_p$, the second term of the equation (1) becomes zero (0), and the equation (2) can be obtained:

$$V_o = V_s(=R_f/R_s) \quad (2)$$

In this way, the power supply fluctuation component can be removed from $V_o$.

Figure 9:
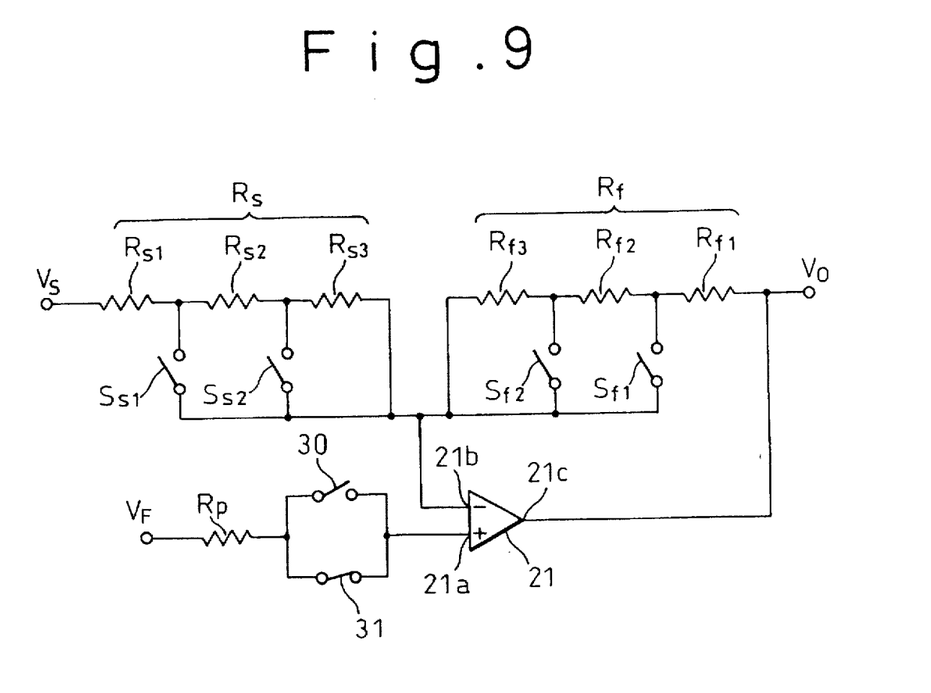
FIG. 9 is a circuit diagram showing an amplification circuit according to the second embodiment of the present invention.

FIG. 9 is a circuit diagram showing the amplification circuit according to the second embodiment of the present invention. By the way, like reference numerals are used in FIG. 9 to identify like constituents as in FIG. 7.

The difference of this embodiment from the first embodiment (shown in FIG. 7) is that two MOS switches 30 and 31 are connected in parallel between the positive input terminal 21a of the operational amplifier 21 and the resistance element $R_f$, one of the switches (the analog switch 31 on the lower side in the drawing) is always kept ON and the other (the analog switch 30 on the upper side in the drawing) is kept always OFF.

The analog switches 30 and 31 comprise the P-channel MOS transistor and the N channel transistor in the same way as the MOS switches $S_{s1}$, $S_{s2}$, $S_{f1}$ and $S_{f2}$ for adjusting $R_s$ and $R_f$ (see FIG. 3).

In addition to the effect of removing signal overlap by the voltage fluctuation induced by the electrode capacitances of the MOS switches $S_{s1}$, $S_{s2}$, $S_{f1}$ and $S_{f2}$ in the same way as the first embodiment, this embodiment has the peculiar effect that the parasitic (electrode) capacitances $C_{MD}$ and $C_{MS}$ between the electrodes of the MOSFET switches $S_{S1}$, $S_{S2}$ and $S_{F2}$, $S_{F2}$ match the parasitic capacitance $C_1$ and $C_2$ between the electrodes of the MOSFET switches 30 and 31 more accurately than in the first embodiment. The parasitic capacitance between the electrodes of the MOS switch fluctuates due to the fluctuation of the power supply voltage VDD or VSS, or the control signal "0" or "1", so that the improvment of the MOSFET configuration for the capacitors at SVRR is desired.

It will be hereby assumed that the size of the P-channel MOS transistor is $P_{30}$, the size of the N-channel MOS transistor is $N_{30}$ for the MOS switch 30, the size of the P-channel MOS transistor is $P_{31}$ and the size of the N-channel MOS transistor is $N_{31}$ for the MOS switch 31, and the sizes of the P-channel MOS transistors are $P_{s1}$, $P_{s2}$, $P_{f1}$ and $P_{f2}$ and the sizes of the N-channel MOS transistors are $N_{s1}$, $N_{s2}$, $N_{f1}$ and $N_{f2}$ for the MOS switches $S_{s1}$, $S_{s2}$, $S_{f1}$ and $S_{f2}$, respectively, the preferred sizes of the P- and N-channel MOS transistors ($P_{30}$, $N_{30}$, $P_{31}$ and $N_{31}$) constituting the MOS switches 30 and 31 are expressed by the following equations (3) to (6):

[analog switch 30 (always OFF)]

$$P_{30}=K(P_{s1}+P_{s2}+P_{f1}+P_{f2}; \text{ with the proviso that those under the ON state are omitted}) \quad (3)$$

$$N_{30}=K(N_{s1}+N_{s2}+N_{f1}+N_{f2}; \text{ with the proviso that those under the ON state are omitted}) \quad (4)$$

[analog switch 31 (always ON)]

$$P_{31}=K(P_{s1}+P_{s2}+P_{f1}+P_{f2}; \text{ with the proviso that those under the OFF state are omitted}) \quad (5)$$

$$N_{31}=K(N_{s1}+N_{s2}+N_{f1}+N_{f2}; \text{ with the proviso that those under the OFF state are omitted}) \quad (6)$$

What is meant by these equations (3) to (6) is, briefly, that the transistor sizes ($P_{30}$, $N_{30}$) of the analog switch 30, which is always OFF, are determined from the total size of the transistors which are OFF among the analog switches $S_{s1}$, $S_{s2}$, $S_{f1}$ and $S_{f2}$; and the transistor sizes ($P_{31}$, $N_{31}$) of the analog switch 31 which is always ON, are determined from the total size of the transistors which are ON. By the way, symbol K represents a constant associated with a reduction ratio of the transistor, and when K=1, $P_{30}$, $N_{30}$, $P_{31}$ or $N_{31}$ coincides with the total size described above and the restriction effect of the power supply fluctuation reaches maximum. On the other hand, the size of the MOS switches 30 and 31 becomes great, and impedes integration. Therefore, K may be set to a value smaller than 1 in consideration of the required restriction level of the power supply fluctuation.

According to the present invention, the fluctuating component of the power supply voltage can be applied to one or the other input of the differential amplifier, and can be cancelled by utilizing the same phase component removing effect of the differential amplifier.

Though the explanation given above shows an MOS switch as the example of the semiconductor analog switches, an analog switch using the bipolar transistors such as the one shown in FIG. 5 can be used.

I claim:

1. An amplification circuit for switching an amplification factor over multiple stages by applying an input signal to the first input terminal of a differential amplifier through an input resistance, applying a reference potential to the second input terminal and switching the resistance value of said input resistance and the resistance value of a feedback resistance by a semiconductor analog switch means, comprising:

a first capacitance element connected between said second input terminal of said differential amplifier and a high potential power supply; and a second capacitance element connected between said second input terminal of said differential amplifier and a low potential power supply.

2. An amplification circuit according to claim 1, wherein a resistance element for increasing the impedance of said second input terminal is connected to said second input terminal of said differential amplifier.

3. An amplification circuit according to claim 1, wherein each of said input resistance and said feedback resistance comprises a plurality of resistors connected in series, and said semiconductor analog switch means is connected between the junction of said resistors of each of said input resistance and said feedback resistance and said first input terminal of said differential amplifier.

4. An amplification circuit according to claim 1, wherein each of said semiconductor analog switch means comprise semiconductor elements, the substrate of said one semiconductor element is connected to said high potential power supply, and the substrate of said the other semiconductor element is connected to said low potential power supply.

5. An amplification circuit according to claim 1, wherein each of said semiconductor analog switch means comprises a parallel circuit of two complementary MOS transistors, a back gate of one of said MOS transistors is connected to said high potential power supply and the back gate of the other of said MOS transistors is connected to said low potential power supply.

6. An amplification circuit for switching an amplification factor over multiple stages by applying an input signal to a first input terminal of a differential amplifier through an input resistance, applying a feedback signal to the first input terminal, applying a reference potential to the second input terminal and switching a resistance value of said input resistance and a resistance value of a feedback resistance by a first semiconductor analog switch means, comprising:

a second semiconductor analog switch means having substantially the same characteristics as those of said first semiconductor analog switch means and connected to said second input terminal, for applying said reference potential to said second input terminal, said second semiconductor analog switch means being comprised of a parallel connection of two analog switches, one of which is turned ON and the other of which is turned OFF.

7. An amplification circuit according to claim 6, wherein a resistance element for increasing an impedance of said second input terminal is connected to said second input terminal of said differential amplifier.

8. An amplification circuit according to claim 6, wherein each of said input resistance and said feedback resistance comprises a plurality of resistors connected in series, and said first semiconductor analog switch means is connected between a junction of the resistors of each of said input resistance and said feedback resistance and said first input terminal of said differential amplifier.

9. An amplification circuit for switching an amplification factor over multiple stages by applying an input signal to a first input terminal of a differential amplifier through an input resistance, applying a feedback signal to the first input terminal, applying a reference potential to the second input terminal and switching a resistance value of said input resistance and a resistance value of a feedback resistance by a first semiconductor analog switch means, comprising:

a second semiconductor analog switch means having substantially the same characteristics as those of said first semiconductor analog switch means and connected to said second input terminal, for applying said reference potential to said second input terminal, wherein each of said first semiconductor analog switch means connected between said input resistance and said first input terminal and said first semiconductor analog switch means connected between said feedback resistance and said first input terminal comprises a parallel circuit of two complementary MOS transistors, a back gate of one of said MOS transistors is connected to said high potential power supply and the back gate of the other of said MOS transistors is connected to said low potential power supply.

10. An amplification circuit according to claim 9, wherein said second semiconductor analog switch means connected between said reference potential and said second input terminal comprises a parallel circuit of two MOS switches one of which is turned ON and the other of which is turned OFF, each of said MOS switches comprises a parallel circuit of two complementary MOS transistors, the back gate of one of said MOS transistors is connected to said high potential power supply and the back gate of the other of said MOS transistors is connected to said low potential power supply.

11. An amplification circuit according to claim 6, wherein each of said first semiconductor analog switch means connected between said input resistance and said first input terminal and said semiconductor analog switch connected between said feedback resistance and said first input terminal comprise semiconductor elements, the substrate of said one semiconductor element is connected to said high potential power supply, and the substrate of said the other semiconductor element is connected to said low potential power supply.

12. An amplification circuit according to claim 11, wherein each of said analog switches comprise semiconductor elements, the substrate of said one semiconductor element is connected to said high potential power supply, and the substrate of said the other semiconductor element is connected to said low potential power supply.

* * * * *